United States Patent
Lai et al.

(10) Patent No.: US 6,492,235 B2
(45) Date of Patent: Dec. 10, 2002

(54) METHOD FOR FORMING EXTENSION BY USING DOUBLE ETCH SPACER

(75) Inventors: Han-Chao Lai, Taichung (TW); Tao-Cheng Lu, Kaohsiung (TW); Hung-Sui Lin, Hsin-Ying (TW)

(73) Assignee: Macronix International Co., Ltd. (TW)

( * ) Notice: Subject to any disclaimer, the term of this patent is extended or adjusted under 35 U.S.C. 154(b) by 15 days.

(21) Appl. No.: 09/770,550

(22) Filed: Jan. 26, 2001

(65) Prior Publication Data

US 2002/0102801 A1 Aug. 1, 2002

(51) Int. Cl.[7] .......................................... H01L 21/336
(52) U.S. Cl. ........................ 438/305; 438/301; 438/303
(58) Field of Search ................................. 438/301, 303, 438/305, 231, 232, 197, 199

(56) References Cited

U.S. PATENT DOCUMENTS 6,136,636 A * 10/2000 Wu ............................ 438/231
6,228,730 B1 * 5/2001 Chen et al. .................. 438/301
6,258,680 B1 * 7/2001 Fulford et al. .............. 438/303
6,294,415 B1 * 9/2001 Tseng et al. ................. 438/197

* cited by examiner

Primary Examiner—John F. Niebling
Assistant Examiner—Walter L. Lindsay, Jr.
(74) Attorney, Agent, or Firm—Powell Goldstein Frazer & Murphy LLP

(57) ABSTRACT

A method for forming extension by using double etch spacer. The method includes at least the following steps. First a semiconductor substrate is provided. Then, the gate is formed on the substrate. A first spacer is formed on a sidewall of the gate. Then, numerous first ions are implanted in the substrate by a mask of both the gate and the first spacer to form the source/drain region. Then, the second spacer is formed by etching the first spacer, wherein the width of the second spacer is less than the width of the first spacer. Finally, numerous second ions are implanted in the substrate by a mask of both the gate and the second spacer to form an extension.

15 Claims, 2 Drawing Sheets

METHOD FOR FORMING EXTENSION BY USING DOUBLE ETCH SPACER

BACKGROUND OF THE INVENTION

1. Field of the Invention

The present invention generally relates to a method for manufacturing a metal-oxide-semiconductors transistor, and more particularly to a method that control the extension lateral diffusion by using a double etch spacer.

2. Description of the Prior Art

In the field of metal oxide semiconductors, the length of the channel becomes shorter as the size of the device is decreased, and the operation time will become shorter, too. However, the length of channel of MOSFET cannot be infinitely shortened, because the short channel of device will result in some problems. This problem is the so-called short channel effect.

The hot carrier effect will be more serious as the channel of the MOSFET is further shortened. There are many methods to solve the issue, and one of them is to lower the operation voltage of the MOSFET. If, for example, the voltage is lowered from 5 V to 2.5 V, the electric field will become too weak to result in hot carrier, and hot carrier effect will be lessened effectly. Another method to lessen the hot carrier effect at least includes the lightly doped drain (LDD), and is called as extension while the concentration is increased. In such a way, a low concentration N-type region is added into a portion of the region of the source/drain region of the MOSFET, and the region is near the channel of the device.

In a conventional process, a substrate is provided with the gate oxide layer in the metal oxide semiconductors, and a gate is formed on it, and an extension is formed by implanting numerous first ions in the substrate, and then the spacer is formed on the sidewalls of the gate. Then the source/drain region is formed by implanting numerous second ions in the substrate. Because a gate is formed, an extension is first formed and then the source/drain region is formed, wherein an extension can be effective to avoid many times thermal process and initial lateral diffusion, such as deposition reaction and ion implantation. If the width of the effective channel length is too short, the short channel effect will be more severe.

For the foregoing reasons, there is a need for a method of forming extension by using double etch spacer to solve the short channel effect.

SUMMARY OF THE INVENTION

In accordance with the present invention, a method is provided for forming extension by using double etch spacer of MOS and substantially can be used to solve the lateral diffuse issue of the conventional process.

One of the objectives of the present invention is to permit extension to accept less and less of a thermal process.

Another of the objective of the present invention is to control the strength of the short channel effect for suppressing the short channel effect in deep submicron.

A further objective of the present invention is to control the strength of the spacer for collocating lateral diffuse by using a double etch spacer.

In order to achieve the above objects of this invention, the present invention provides a method for forming extension by using double etch spacer. The method at least includes the following steps. First of all, a semiconductor substrate is provided. Then, the gate on the substrate is formed. A first spacer is formed on a sidewall of the gate. Then, numerous first ions are implanted in the substrate by a mask of both the gate and the first spacer to form a source/drain region. Then, the second spacer is formed by etching the first spacer, wherein the width of the second spacer is less than the width of the first spacer. Finally, numerous second ions are implanted in the substrate by a mask of both the gate and the second spacer to form an extension.

BRIEF DESCRIPTION OF THE DRAWINGS

The foregoing aspects and many of the attendant advantages of this invention will become more readily appreciated as the same becomes better understood by referring to the following detailed description, when taken in conjunction with the accompanying drawings, wherein.

DESCRIPTION OF THE PREFERRED EMBODIMENT

Some embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

FIG. 1A to FIG. 1D are cross-sectional views of a method for forming extension of using double etch spacer process in accordance with one embodiment of the present invention.

Figure 1A:
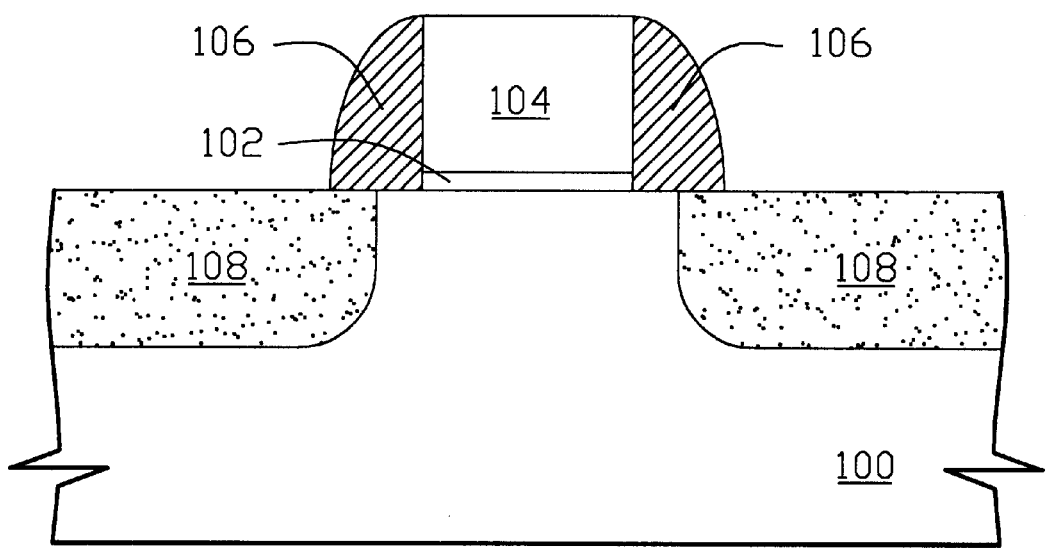
FIG. 1A is a cross-sectional view of a structure having the gate, the spacer and the source/drain region are sequentially formed thereon in accordance with one embodiment of the present invention.

Referring to FIG. 1A, a semiconductor substrate 100 is first provided, which comprises polysilicon substrate, and the gate oxide layer 102 is formed on the semiconductor substrate 100. Then, forms the gate 104 on the gate oxide layer 102, and forms the first spacer 106 on a sidewall of the gate 104. Then, numerous first ions are implanted to substrate 100 by a mask of both the gate 104 and the first spacer 106 to form the source/drain region 108, whereby, available varieties of first ions at least include $B^{+3}$ and $BF_2^+$.

Figure 1B:
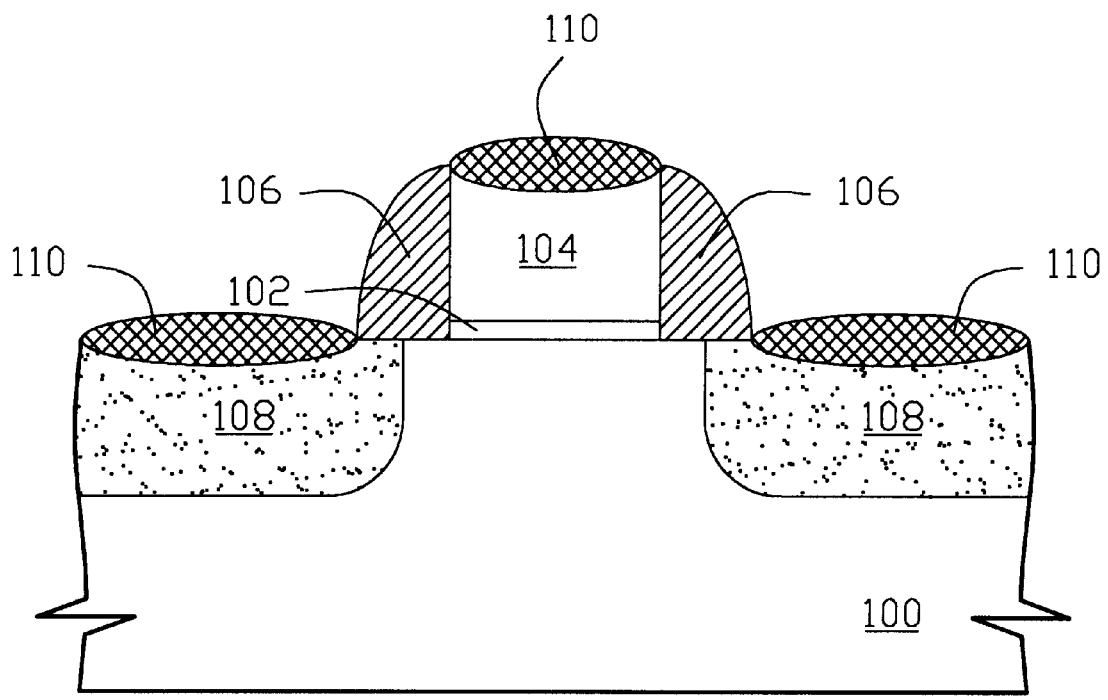
FIG. 1B is cross-sectional view of forming the silicide over the structure FIG. 1A.

Referring to FIG. 1B, an optional step is that a silicide 110 is formed on the gate 104 and on the substrate 100. Silicide 110 comprises $TiSi_2$ and $CoSi_2$, and silicide 110 usually is formed by the rapid thermal process.

Figure 1C:
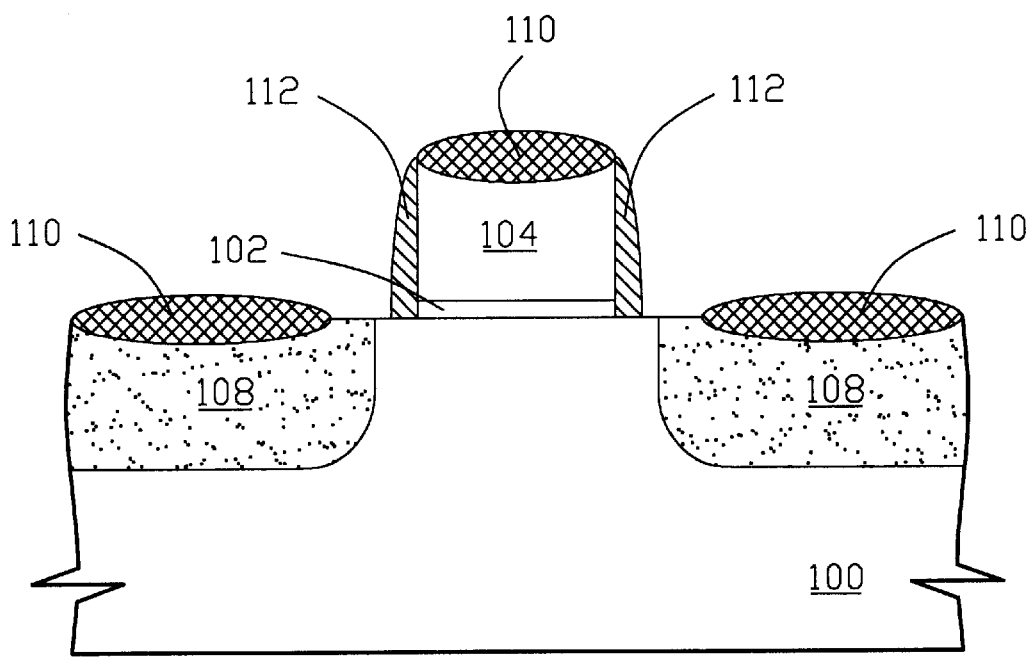
FIG. 1C is cross-sectional view of etching the spacer over the structure of FIG. 1B.

Referring to FIG. 1C, as a key step in this invention, form the second spacer 112 is formed by etching first spacer 106, wherein the width of the second spacer is less than the width of the first spacer 106, and second spacer 112 is formed by an anisotropic etch method.

Figure 1D:
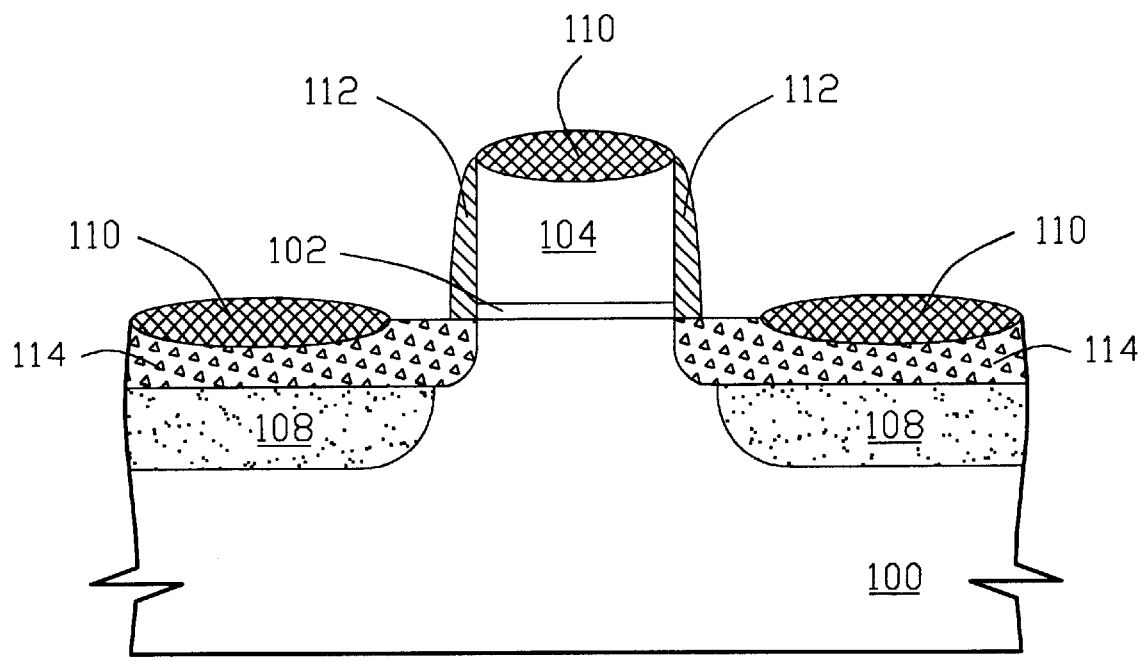
FIG. 1D is cross-sectional view of forming an extension by implanting numerous ions closed to the structure of FIG. 1C.

Finally, referring to FIG. 1D, numerous second ions are implanted in substrate 100 by a mask of both the gate 104 and the second spacer 112, whereby, available varieties of second ions at least include $B^{+3}$ and $BF_2^+$. Next, a low concentration region, extension 114 is formed in portion region of source/drain regions 108. Obviously, because that extension 114 is formed after source/drain regions have been formed, lateral diffusion of extension 114 can be effectively provided by avoiding thermal processes such as deposition reaction and ions implantation. In other ways, for the present invention, the contuse of extension 114 is not obviously broadened because only a thermal process is used after second ions are implanted. Thus the effective length of channel is properly controlled and then the effect of the short channel effect is properly decreased.

In accordance with the present invention, it is apparent that there has been provided a method of forming an extension by using a double etching spacer which overcomes the disadvantages of the prior art. The present invention is inexpensive and uncomplicated, and can easily be integrated into conventional process flows without significantly increasing cycle time and to decrease thermal process.

Although specific embodiments have been illustrated and described, it will be obvious to those skilled in the art that various modifications may be made without departing from what is intended to be limited solely by the appended claims.

What is claimed is:

1. A method for forming a transistor, comprising:

providing a semiconductor substrate;

forming a gate on said substrate;

forming a first spacer on a sidewall of said gate;

using said gate and said first spacer as a mask to form a source/drain region by implanting a plurality of first ions in said substrate;

forming a second spacer by etching said first spacer, wherein the width of said second spacer is less than the width of said first spacer; and using said gate and said second spacer as a mask to form an extension by implanting a plurality of second ions in said substrate.

2. The method according to claim 1, wherein said semiconductor substrate comprises silicon substrate.

3. The method according to claim 1, wherein said first spacer is formed by an anisotropic etch.

4. The method according to claim 1, wherein said first ions and said second ions have the same electricity.

5. The method according to claim 1, wherein available varieties of said first ions comprise $B^{+3}$ and $BF_2^+$.

6. The method according to claim 1, wherein available varieties of said second ions comprise $B^{+3}$ and $BF_2^+$.

7. The method according to claim 1, further comprises to change the contour of said extension by performing a rapid thermal process after said second ions are implanted.

8. A method for forming a transistor, comprising:

providing a semiconductor substrate;

forming a gate on said substrate;

forming a spacer on a sidewall of said gate;

using said gate and said first spacer as a mask to form a source/drain region by implanting a plurality of first ions in said substrate;

forming a silicide on top of said gate and the surface of said source/drain region;

forming a second spacer by etching said first spacer, wherein the width of said first spacer is less than the width of said first spacer; and using said gate and said second spacer as a mask to form an extension by implanting a plurality of second ions in said substrate.

9. The method according to claim 8, wherein said semiconductor substrate comprises silicon substrate.

10. The method according to claim 8, wherein said first spacer is formed by an anisotropic etch.

11. The method according to claim 8, wherein said first ions and said second ions have the same electricity.

12. The method according to claim 8, wherein available varieties of said first ions comprise $B^{+3}$ and $BF_2^+$.

13. The method according to claim 8, wherein available varieties said second ions comprise $B^{+3}$ and $BF_2^+$.

14. The method according to claim 8, wherein available varieties of said silicide comprises $TiSi_2$ and $CoSi_2$.

15. The method according to claim 8, further comprises to change the contour of said extension by performing a rapid thermal process after said second ions are implanted.

* * * * *